(12) United States Patent
Matsui

(10) Patent No.: US 7,006,936 B2
(45) Date of Patent: Feb. 28, 2006

(54) PULSE WIDTH MEASURING DEVICE WITH AUTOMATIC RANGE SETTING FUNCTION

(75) Inventor: Satoshi Matsui, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/085,138

(22) Filed: Mar. 22, 2005

(65) Prior Publication Data
US 2005/0165569 A1  Jul. 28, 2005

Related U.S. Application Data

(63) Continuation of application No. PCT/JP2003/004571, filed on Apr. 10, 2003.

(51) Int. Cl.
*G06F 19/00* (2006.01)

(52) U.S. Cl. .............. 702/79; 702/56; 702/66; 702/78; 702/79; 327/175; 329/312; 375/238; 375/360; 73/104.14

(58) Field of Classification Search ............... 702/55, 702/66, 78–79; 327/175; 329/312; 375/238, 375/360; 73/204.14; 320/145; 331/25
See application file for complete search history.

(56) References Cited

U.S. PATENT DOCUMENTS

| | | | |
|---|---|---|---|
| 5,347,505 A * | 9/1994 | Moritsugu et al. | 369/59.12 |
| 5,770,853 A * | 6/1998 | Konno et al. | 250/214 LS |
| 6,795,491 B1 * | 9/2004 | Fleming et al. | 375/213 |
| 2004/0247066 A1 * | 12/2004 | Suda | 375/376 |

FOREIGN PATENT DOCUMENTS

JP   7-27804 A1   1/1995
JP   11-337600 A1   12/1999

OTHER PUBLICATIONS

Nohama et al., 'A Novel Method for Analog Measuring of Pulse Width and Rise Time of Defibrillating Shocks', Oct. 1999, IEEE Publication, BMES/EMBS Confirence, p. 318.*
Cantoni et al., 'Design Note: Compact Electronic System to Display Pulsed Laser Beam Parameters', 1986, The Institute of Physics Publication, pp. 985-986.*
Ziemer, 'Pulse Modulation', 2002, CRC Press LLC, pp. 1-12.*

* cited by examiner

Primary Examiner—Marc S. Hoff
Assistant Examiner—Elias Desta
(74) Attorney, Agent, or Firm—Arent Fox, PLLC.

(57) ABSTRACT

A pulse width measuring device is disclosed that calculates the pulse width of a signal to be measured, based on a count value and a count clock signal. In the pulse width measuring device, the counter circuit has a plurality of bits that are divided into an exponent and a significand. The control unit of the pulse width measuring device includes: an exponent storing unit that stores an exponent setting value that represents the number of bits of the exponent of the counter circuit; and a decoder unit that generates a count value setting signal for rewriting the count value of the counter circuit, based on the exponent setting value stored in the exponent storing unit, when the count value overflows in the counter circuit, the decoder unit then outputting the count value setting signal to the counter circuit.

8 Claims, 7 Drawing Sheets

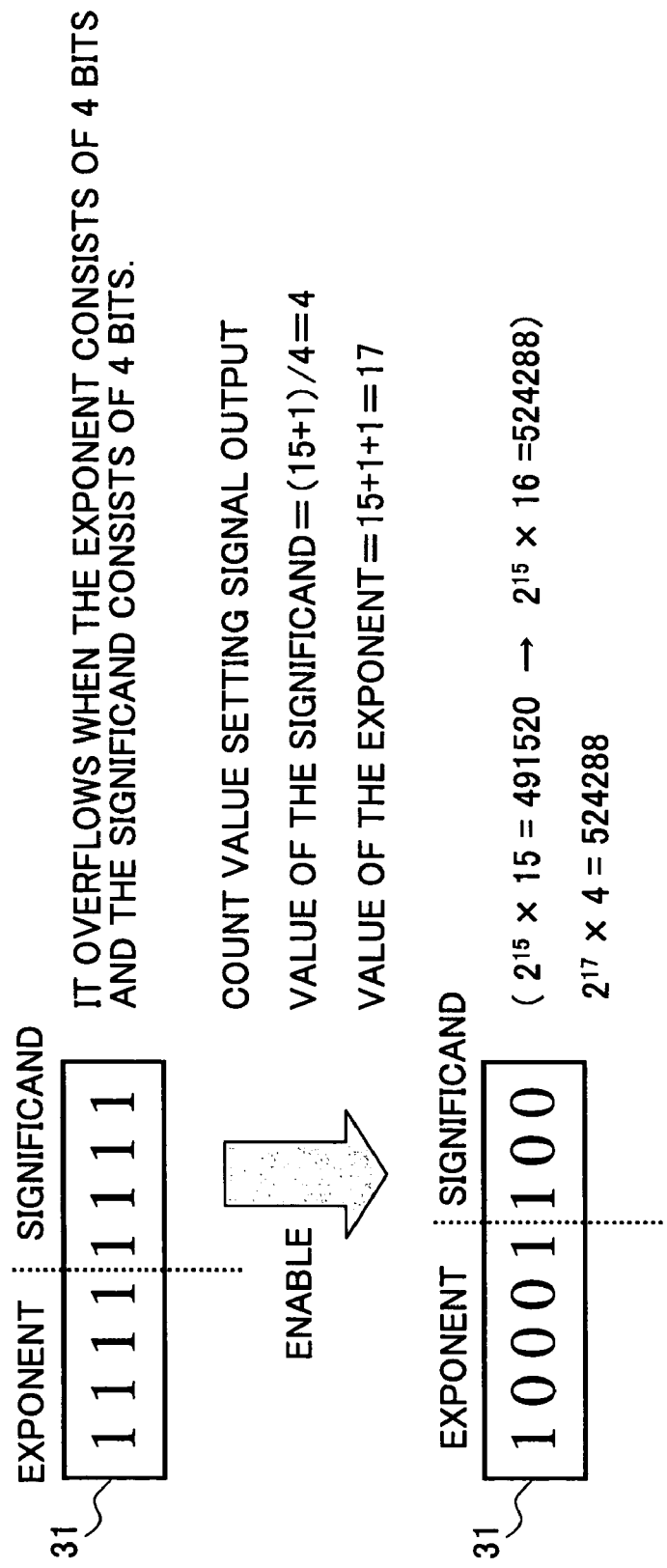

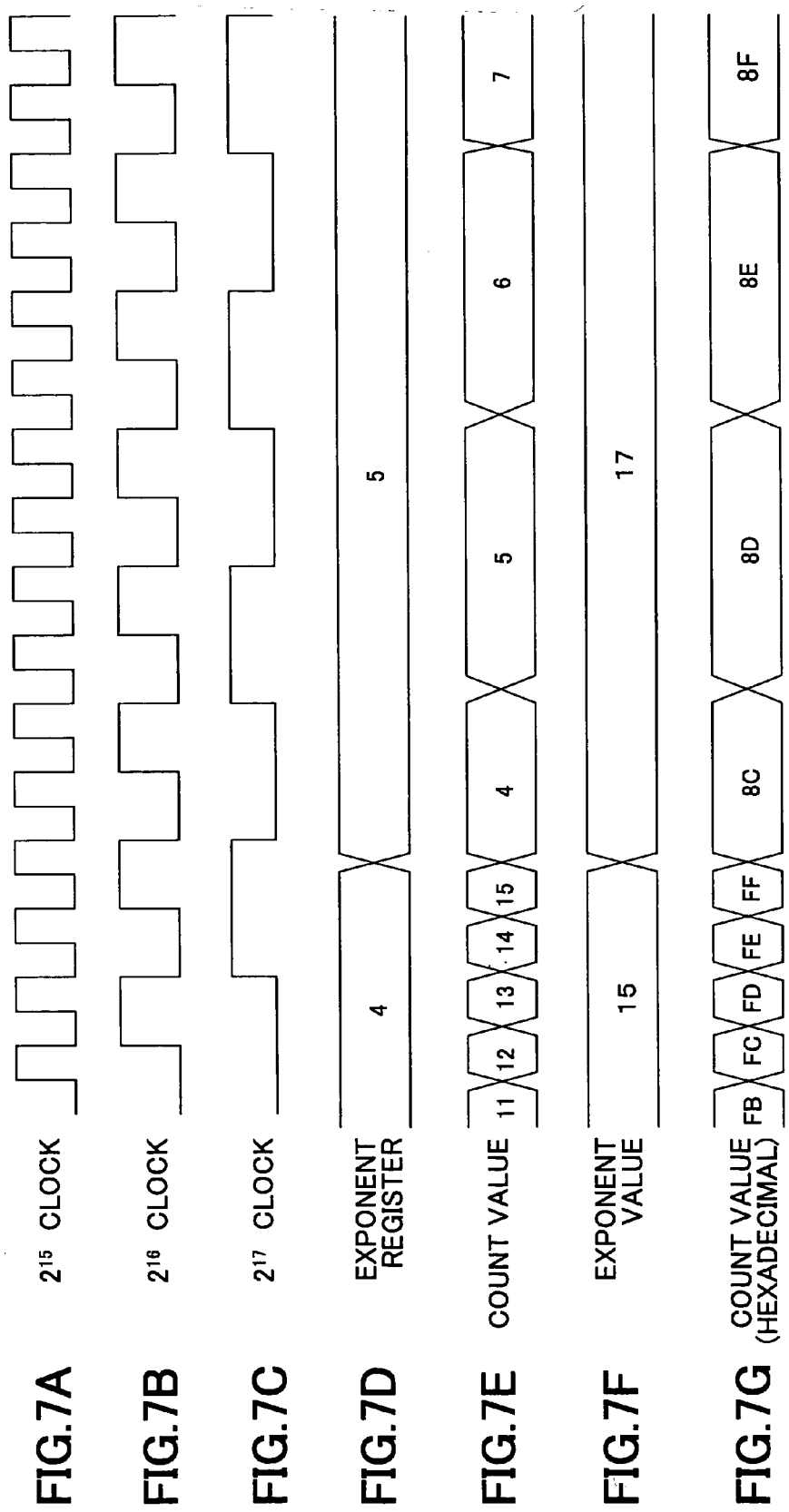

PULSE WIDTH MEASURING DEVICE WITH AUTOMATIC RANGE SETTING FUNCTION

CROSS-REFERENCE TO RELATED APPLICATION

This application is a U.S. continuation application filed under 35 USC 111(a) claiming benefit under 35 USC 120 and 365(c) of PCT International Application No. PCT/JP2003/004571 filed on Apr. 10, 2003, which is hereby incorporated herein by reference.

FIELD OF THE INVENTION

The present invention relates to a pulse width measuring device that measures (or counts) the pulse width or the pulse period of a signal to be measured, such as a pulse width counter and an input capture.

BACKGROUND OF THE INVENTION

A conventional pulse width measuring device performs a counting operation in a predetermined measurement range. Accordingly, the pulse width of a signal to be measured in the predetermined measurement range can be accurately measured. However, when a signal having a pulse width outside the predetermined measurement range is input, the counter overflows, and the pulse width cannot be accurately measured.

To counter this problem, Japanese Laid-Open Patent Application No. 7-27804 discloses a pulse width measuring device that utilizes the technique of constantly setting the clock frequency of the counter at the optimum value for the pulse width of a signal to be measured.

FIG. 4 illustrates the structure of the pulse width measuring device that is disclosed in Japanese Laid-Open Patent Application No. 7-27804.

In FIG. 4, the pulse width measuring device includes a data register 3, an edge detecting circuit 6, a control circuit 7, a counter circuit 11, a selector circuit 15, and a divider 17.

In the pulse width measuring device shown in FIG. 4, the edge detecting circuit 6 detects the rise and fall of a measured signal IN, and outputs a detection signal EG1 and a detection signal EG2 to the control circuit 7. Based on the detection signals EG1 and EG2 from the edge detecting circuit 6, the control circuit 7 outputs a count enabling signal ENABLE to the counter circuit 11. The count enabling signal ENABLE is a count start/end signal for indicating the start and the end of a counting operation.

In the pulse width measuring device shown in FIG. 4, the counter circuit 11 counts a count clock signal CLK, starting from when the count enabling signal ENABLE that is output from the control circuit 7 switches to H level (the start of the counting operation) until the count enabling signal ENABLE switches to L level (the end of the counting operation). The counter circuit 11 then outputs the count value to the data register 3. The data register 3 stores and holds the count value of the counter circuit 11.

When each bit value of the counter circuit 11 changes from FFH to 00H (or when the count value overflows) in a counting operation, the counter circuit 11 shifts the count value 1 bit lower, and outputs a control signal CO to the selector circuit 15.

In the pulse width measuring device of FIG. 4, based on the count value stored in the data register 3 and the period of the count clock signal CLK, the pulse width of the measured signal IN is calculated.

The divider 17 divides a master clock signal MCLK to generate and output clock signals CLK0 through CLKn of different frequencies. Based on the control signal CO from the counter circuit 11, the selector circuit 15 selects each clock signal from the clock signals CLK0 through CLKn generated from the divider 17, starting from the clock signal of the higher frequency to the clock signal of the lower frequency. The selector circuit 17 then outputs each selected signal to the counter circuit 11 as the count clock signal CLK.

FIG. 5 illustrates the structure of the selector circuit 15 of the pulse width measuring device of FIG. 4.

Here, it is assumed that the divider 17 of FIG. 4 outputs the clock signals CLK0 through CLKn (n=3) of four different frequencies, which are obtained by dividing the master clock signal MCLK, to the selector circuit 15.

In the selector circuit 15 shown in FIG. 5, the control signal CO that is output from the counter circuit 11 of FIG. 4 is input to a counter 19 that consists of 2 bits. The counter 19 counts the control signal CO, and outputs the count value to a decoder 20.

Also, the count enabling signal ENABLE that is output from the control circuit 7 of FIG. 4 is input as a reset signal to the counter 19. When the count enabling signal ENABLE switches to the L level (the end of the counting operation), the count value of the counter 19 is reset.

Based on the 2-bit output signal from the counter 19, the decoder 20 outputs a 4-bit clock select signal to a selector 13. Among the four bits of the clock select signal, only one bit is at H level. The clock select signal is sent to one input terminal of the selector 13.

The four clock signals CLK0 through CLKn that are output from the divider 17 are input to the other input terminal of the selector 13. Based on the clock select signal, the selector 13 selects a clock signal from the clock signals CLK0 through CLKn, and outputs the selected clock signal as the count clock signal CLK.

In the selector 13 of FIG. 5, the count clock signal CLK is selected from the clock signals CLK0 through CLKn, based on the clock select signal from the decoder 20. Every time the counter 19 counts up, the decoder 20 select a clock signal from the clock signals CLK0 through CLKn, starting from the clock signal CLK0 of the highest frequency to the clock signal CLKn of the lowest frequency.

In the pulse width measuring device of FIG. 4, so as to calculate the pulse width of the measured signal IN based on the count value stored in the data register 3 and the period of the count clock signal CLK, it is necessary to obtain the period information as to the count clock signal CLK. Therefore, the selector circuit 15 of FIG. 4 stores and holds the output signal from the counter 19 as the period information as to the counter clock signal CLK in an internal register (not shown).

In the pulse width measuring device of FIG. 4, when the count value overflows in a counting operation, the counter circuit 11 halves the count value (or shifts the count value 1 bit lower), thereby doubling the period of the count clock signal CLK (or selects a clock signal with a frequency a step higher than the frequency of the previous count clock signal). Thus, the counting operation is continued.

In the pulse width measuring device of FIG. 4, however, the number of bits in the internal register for selecting the clock frequency needs to be increased, so that the counting operation is further continued even after a measured signal having a pulse width outside the predetermined measurement range is input.

Also, the number of bits in the internal register directly affects the circuit size of the pulse width measuring device of FIG. 4. If the number of bits in the internal register increases, the circuit size of the pulse width measuring device also increases, resulting in an increase in cost.

SUMMARY OF THE INVENTION

A general object of the present invention is to provide a pulse width measuring device in which the above disadvantages are eliminated.

A more specific object of the present invention is to provide a pulse width measuring device that can automatically select a clock frequency that is suitable for the pulse width of a signal to be measured, and can prevents the counter circuit from overflowing as well as an increase in circuit size.

The above objects of the present invention are achieved by a pulse width measuring device that includes: an edge detecting circuit that outputs a detection signal, detecting a rise or fall of a signal to be measured; a control unit that outputs a count start/end signal, based on the detection signal; a counter circuit that counts a count clock signal, based on the count start/end signal; a count value storing unit that stores the count value of the counter circuit; and a selector circuit that selects a clock signal from a plurality of clock signals of different frequencies, based on a clock select signal, and outputs the selected clock signal as the count clock signal. This pulse width measuring device calculates the pulse width of the signal to be measured, based on the count value and the count clock signal. In the pulse width measuring device, the counter circuit has bits that are divided into an exponent and a significand. Also, in the pulse width measuring device, the control unit includes: an exponent storing unit that stores an exponent setting value that represents the number of bits of the exponent of the counter circuit; and a decoder unit that generates a count value setting signal for rewriting the count value of the counter circuit, based on the exponent setting value stored in the exponent storing unit, when the count value overflows in the counter circuit, the decoder unit then outputting the count value setting signal to the counter circuit.

With the pulse width measuring device of the present invention, the bit width of the counter circuit is divided into an exponent and a significand, so that the optimum clock frequency for the pulse width to be measured can be automatically selected from a wide clock range, using the counter circuit that has the limited number of bits. Also, the pulse width measuring device of the present invention can prevent the counter circuit from overflowing, and can also prevent an increase in circuit size, while continuing a counting operation.

BRIEF DESCRIPTION OF THE DRAWINGS

The above and other objects, features, and advantages of the present invention will become more apparent from the following description taken in conjunction with the accompanying drawings:

FIG. 6 illustrates the operation of the counter circuit of a pulse width measuring device in accordance with the present invention; and FIGS. 7A through 7G are waveform charts illustrating the operation of a pulse width measuring device in accordance with the present invention.

DESCRIPTION OF THE PREFERRED EMBODIMENTS

The following is a description of embodiments of the present invention, with reference to the accompanying drawings.

Figure 1:
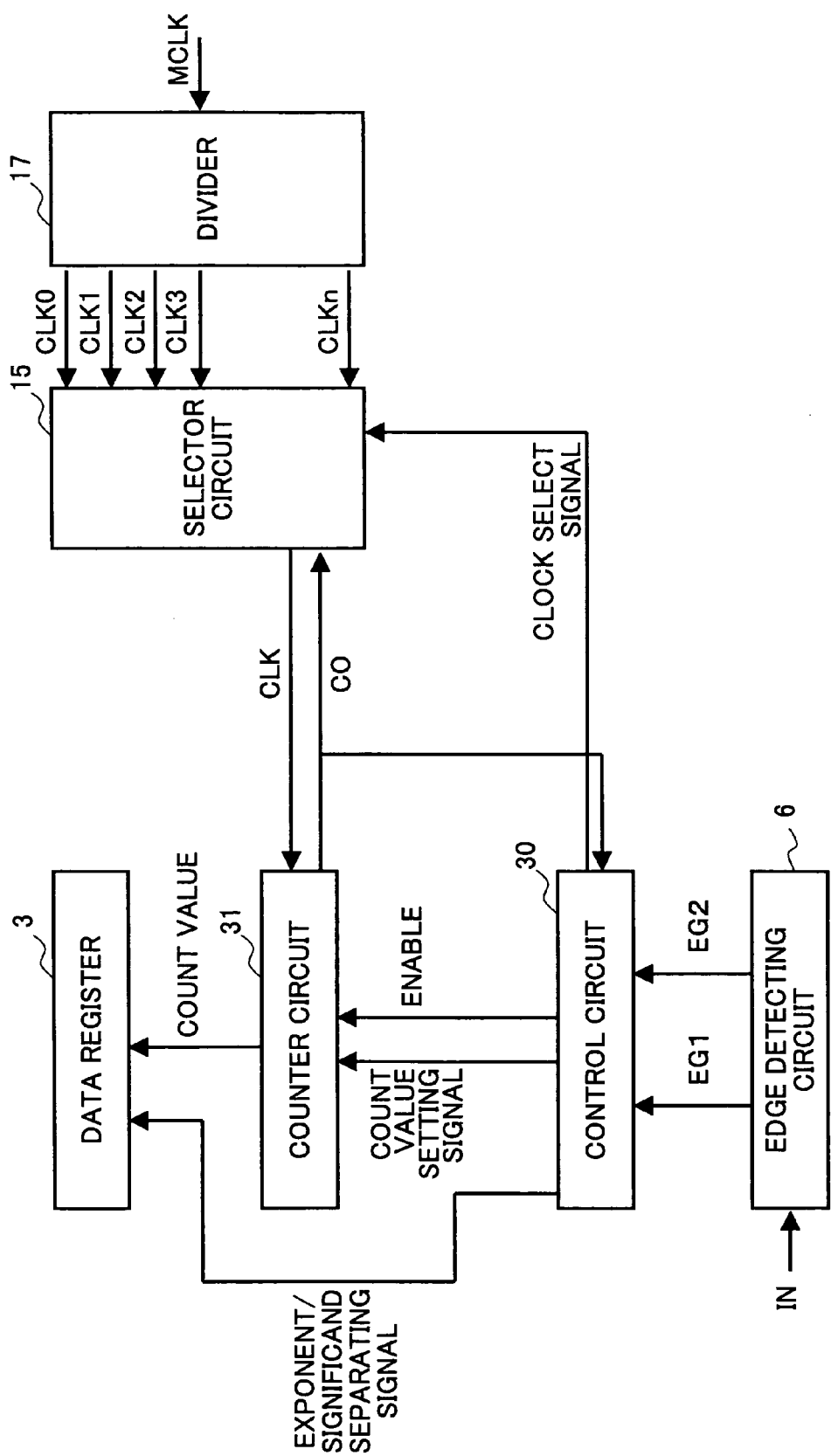
FIG. 1 is a block diagram illustrating the structure of a pulse width measuring device in accordance with the present invention.

FIG. 1 illustrates the structure of a pulse width measuring device in accordance with the present invention.

Figure 4:
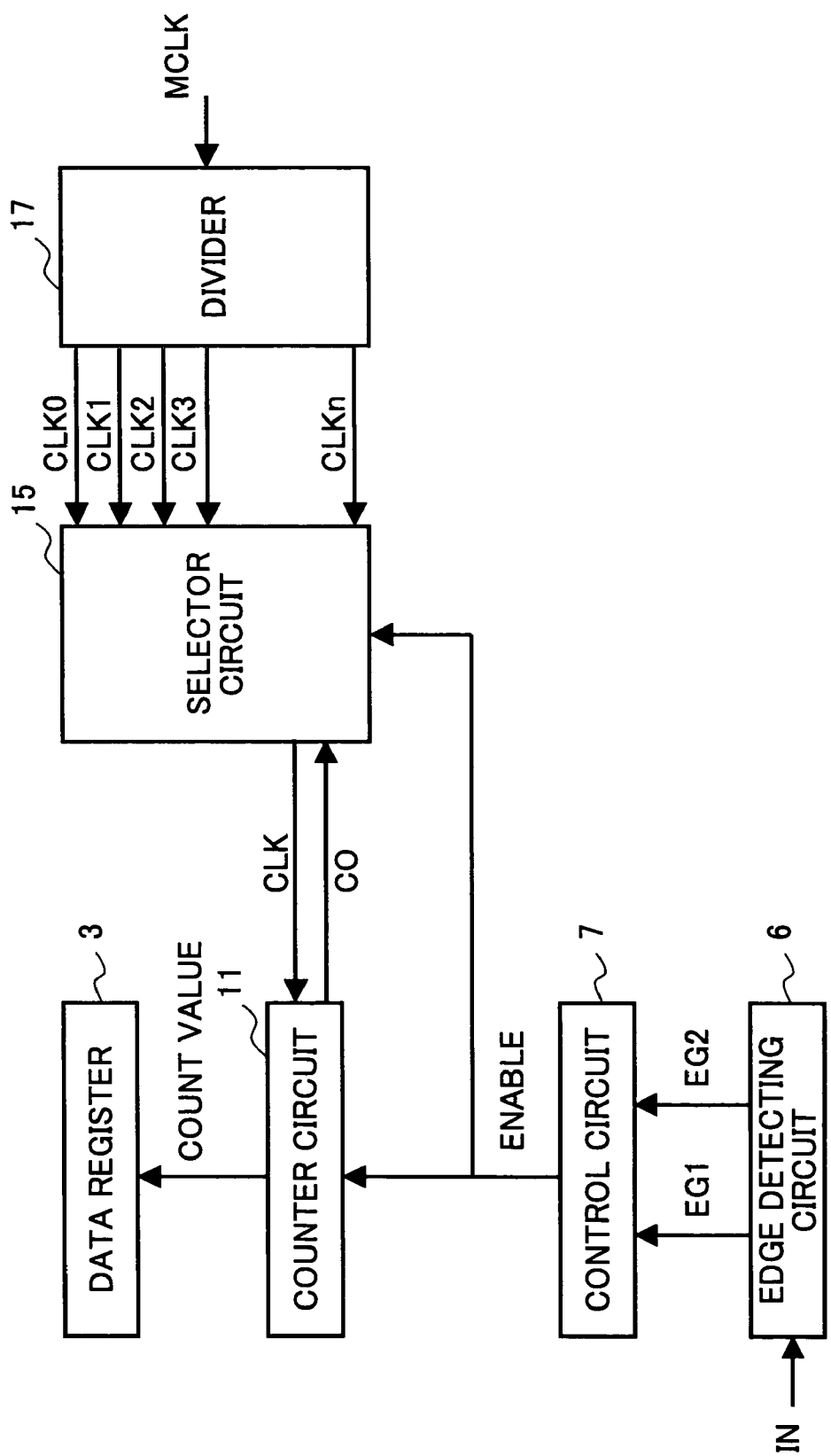
FIG. 4 is a block diagram illustrating the structure of a conventional pulse width measuring device.

In FIG. 1, the same components as those of the pulse width measuring device of FIG. 4 are denoted by the same reference numerals as those in FIG. 4, and explanation of them is omitted in the following description.

The pulse width measuring device of FIG. 1 includes a data register 3, an edge detecting circuit 6, a control circuit 30, a counter circuit 31, a selector circuit 15, and a divider 17.

In the pulse width measuring device of FIG. 1, a master clock signal MCLK is input to the divider 17, and the divider 17 divides or sequentially multiplies the master clock signal MCLK into clock signals CLK0 through CLKn of different frequencies. The divider 17 then outputs the clock signals CLK0 through CLKn. Here, the number of clock signals does not matter.

Based on a clock select signal transmitted from the control circuit 30, the selector circuit 15 selects clock signals from the clock signals CLK0 through CLKn generated from the divider 17, starting from a clock signal of a higher frequency. The selector circuit 15 then outputs the selected signals as count clock signals CLK to the counter circuit 31.

The counter circuit 31 counts the count clock signals CLK that are output from the selector circuit 15, starting from the time when a count enabling signal ENABLE that is output from the control circuit 30 switches to H level (the start of the counting operation) until the count enabling signal ENABLE switches to L level (counting operation end). The counter circuit 31 then outputs the count value to the data register 3. The data register 3 in turn stores the count value that is output from the counter circuit 31.

As each bit value of the counter circuit 31 changes from FFH to 00H along with the counting operation (or the count value overflows), the counter circuit 31 outputs a control signal CO to the selector circuit 15 and the control circuit 30.

The edge detecting circuit 6 detects the rise and fall of a measured signal IN, and outputs a detection signal EG1 and a detection signal EG2 to the control signal 30.

Based on the detection signals EG1 and EG2 that are output from the edge detecting circuit 6, the control circuit 30 generates the count enabling signal ENABLE that is a count starting/ending signal for starting or ending a count operation. The control circuit 30 then outputs the count enabling signal ENABLE to the counter circuit 31.

The control circuit 30 generates an exponent/significand separating signal for separating the exponent and the significand of each bit width of the counter circuit 31. The control circuit 30 then outputs the signal to the data register 3. The control circuit 30 further generates a count value setting signal for writing the count value in the counter circuit 31, and outputs the signal to the counter circuit 31.

In the pulse width measuring device of FIG. 1, based on the count value stored in the data register 3 and the exponent/significand separating signal that is output from the control circuit 30, the pulse width of the measured signal IN is calculated.

As described above, the pulse width measuring device of the present invention divides the bit number of the counter circuit 31 into an exponent and a significand, thereby counting the pulse width of a measured signal with a count clock signal using the counter circuit 31 having a limited bit number.

Figure 3:
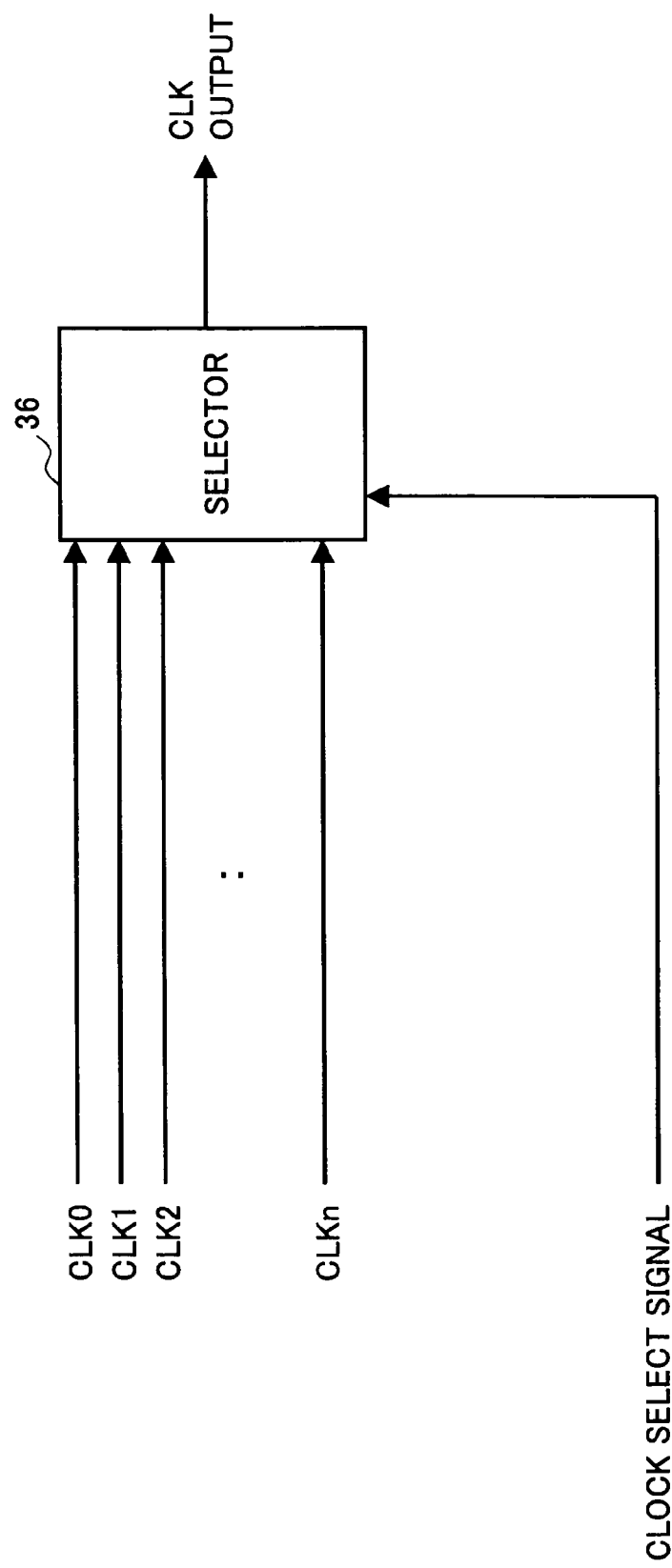
FIG. 3 is a block diagram illustrating the selector circuit of the pulse width measuring device of FIG. 1.

FIG. 3 shows the selector circuit 15 of the pulse width measuring device of FIG. 1.

Figure 5:
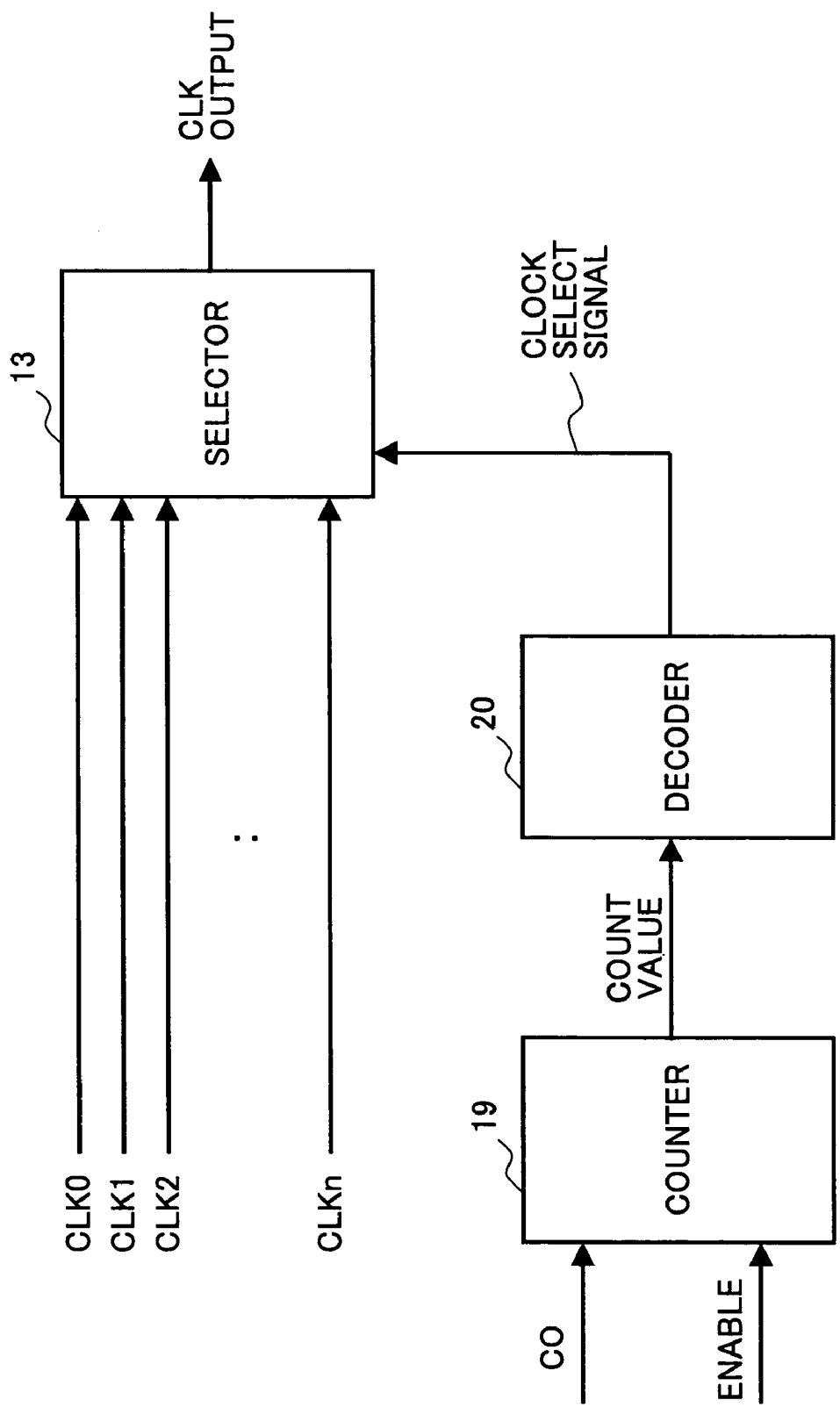
FIG. 5 is a block diagram illustrating the selector circuit of the structure of FIG. 4.

As shown in FIG. 3, the selector circuit 15 is formed only with a selector 36. It is not necessary to include the counter 19 and the decoder 20 as in the structure shown in FIG. 5.

In FIG. 3, the clock signals CLK0 through CLKn that are output from the divider 17 are input to an input end of the selector 36. The clock select signal that is output from the control circuit 30 is input to the other input end of the selector 36. The clock select signal includes bits among which only one bit is at H level. The number of bits of the clock select signal is equivalent to the number of the clock signals CLK0 through CLKn that are output from the divider 17.

Based on the clock select signal, the selector 36 select a clock signal from the clock signals CLK0 through CLKn, and outputs the selected clock signal as the count clock signal CLK.

Next, the operation of the counter circuit 31 of the pulse width measuring device of the present invention is described.

For ease of explanation, a counter having 8 bits as the bit width is employed as the counter circuit 31.

When the 8-bit counter performs a counting operation in the same manner as a regular counter (exponent: 0 bit, significand: 8 bits), the count value that can be counted at the lowest clock frequency ranges from 1 to $2^8$ (=256).

If the counter circuit 31 is a counter having an exponent of 1 bit and a significand of 7 bits, the count value that can be counted at the lowest clock frequency ranges from 1 to 128×2 (=256).

If the counter circuit 31 is a counter having an exponent of 2 bits and a significand of 6 bits, the count value that can be counted ranges from 1 to 64×8 (=512). If the counter circuit 31 is a counter having an exponent of 3 bits and a significand of 5 bits, the count value that can be counted ranges from 1 to 32×128 (=4096). If the counter circuit 31 is a counter having an exponent of 4 bits and a significand of 4 bits, the count value that can be counted ranges from 1 to 16×32768 (=524288). If the counter circuit 31 is a counter having an exponent of 5 bits and a significand of 3 bits, the count value that can be counted ranges from 1 to $8 \times 2^{31}$ (=$2^{34}$)

Accordingly, in the pulse width measuring device of the present invention, the bit number of the exponent of the counter circuit is varied so as to prevent the counter circuit from overflowing, while the pulse width of the measured signal IN can be counted even if it exhibits a large count value.

When the exponent of the 8-bit counter is set at 1 bit, the counting operation of the counter circuit 31 is as follows (the upper bit of the counter being the exponent, and the lower bits of the counter being the significand).

$$00000000 \rightarrow 1 \times 0 = 0$$
$$00000001 \rightarrow 1 \times 1 = 1$$
$$00000010 \rightarrow 1 \times 2 = 2$$
$$00000011 \rightarrow 1 \times 3 = 3$$
$$\vdots$$
$$01111111 \rightarrow 1 \times 127 = 127$$
$$11000000 \rightarrow 2 \times 64 = 128$$
$$\vdots$$
$$11111111 \rightarrow 2 \times 127 = 254$$

When the count value overflows while the exponent is formed with 1 bit, the exponent of the 8-bit counter is changed to 2 bits, and the counting operation of the counter circuit 31 continues as follows:

$$11100000 \rightarrow 8 \times 32 = 256$$
$$\vdots$$
$$11111111 \rightarrow 8 \times 63 = 504$$

When the count value overflows while the exponent is formed with 2 bits, the exponent of the 8-bit counter is changed to 3 bits, and the counting operation of the counter circuit 31 continues as follows:

$$10110000 \rightarrow 32 \times 16 = 512$$
$$\vdots$$
$$10111111 \rightarrow 32 \times 31 = 992$$
$$11010000 \rightarrow 64 \times 16 = 1024$$
$$\vdots$$
$$11011111 \rightarrow 64 \times 31 = 1984$$
$$11110000 \rightarrow 128 \times 16 = 2048$$
$$\vdots$$
$$11111111 \rightarrow 128 \times 31 = 3968$$

When the count value overflows while the exponent is formed with 3 bits, the exponent of the 8-bit counter is changed to 4 bits, and the counting operation of the counter circuit 31 continues as follows:

$$10011000 \rightarrow 512 \times 8 = 4096$$
$$\vdots$$
$$10011111 \rightarrow 512 \times 15 = 7680$$
$$10101000 \rightarrow 1024 \times 8 = 8192$$
$$\vdots$$
$$10101111 \rightarrow 1024 \times 15 = 15360$$
$$10111000 \rightarrow 2048 \times 8 = 16384$$
$$\vdots$$
$$11111111 \rightarrow 32768 \times 15 = 491520$$

When the count value overflows while the exponent is formed with 4 bits, the exponent of the 8-bit counter is changed to 5 bits, and the counting operation of the counter circuit 31 continues as follows (see FIGS. 6 and 7):

$$10001100 \rightarrow 131072 \times 4 = 524288$$

$$\vdots$$

Figure 2:
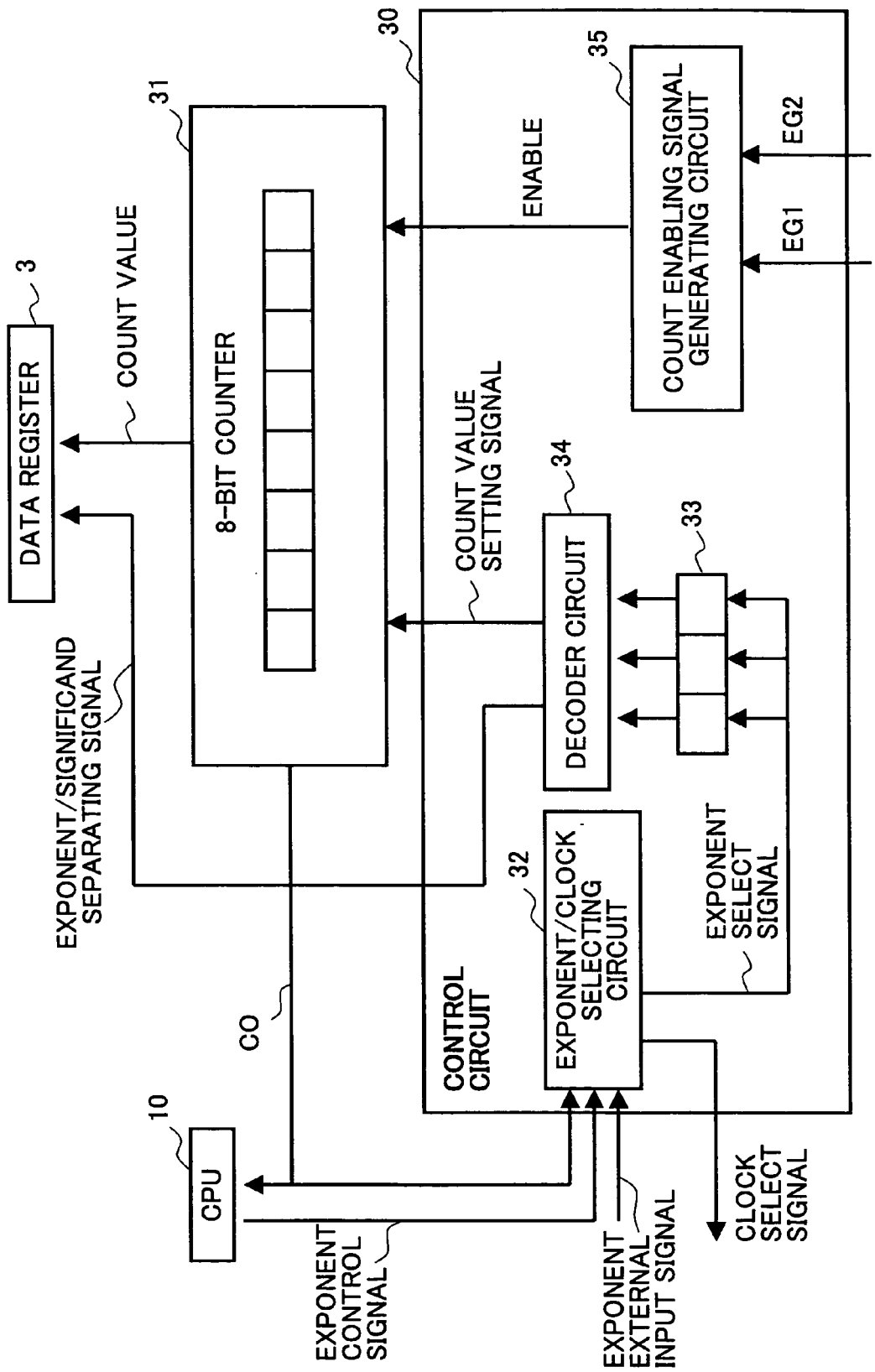
FIG. 2 is a block diagram illustrating a pulse width measuring device as one embodiment of the present invention.

FIG. 2 illustrates a pulse width measuring device in accordance with an embodiment of the present invention.

The pulse width measuring device of FIG. 2 includes a data register 3, a counter circuit 31, a CPU 10, and a control circuit 30. The control circuit 30 includes an exponent/clock selecting circuit 32, an exponent register 33, a decoder circuit 34, and a count enabling signal generating circuit 35.

Like the structure of FIG. 1, the pulse width measuring device of FIG. 2 also includes an edge detecting circuit 6, a selector circuit 15, and a divider 17. However, those circuits are not shown in FIG. 2, for ease of explanation.

In FIG. 2, an exponent setting value that is stored in the exponent register 33 represents the bit number of the exponent of the counter circuit 31. In the example shown in FIG. 2, the number of bits in the exponent register 33 is three. However, the number of bits in the exponent register 33 varies with the number of bits in the counter circuit 31. If the counter circuit 31 is an 8-bit counter, the number of bits in the exponent register 33 needs to be three.

In the exponent register 33, it is possible to write from the CPU 10 and the exponent/clock selecting circuit 32. The exponent setting value that is written in the exponent register 33 sets the number of bits of the exponent in the counter circuit 31.

In the example shown in FIG. 2, the counter circuit 31 is an 8-bit counter. As described above, in the regular operation, the counter circuit 31 can count the pulse width of the measured signal IN, regardless of the dividing of the exponent and the significand.

When the counter value of the counter circuit 31 changes from FFH to 00H, the counter circuit 31 outputs the control signal CO to the CPU 10 and the control circuit 30.

In the control circuit 30 shown in FIG. 2, the exponent/clock selecting circuit 32 generates a clock select signal based on the control signal CO from the counter circuit 31, and then outputs the clock select signal to the selector circuit 15. Based on the control signal CO from the counter circuit 31, the CPU 10 adjusts the exponent and the significand of the counter circuit 31, and outputs an exponent control signal to the exponent/clock selecting circuit 32. Based on the exponent control signal from the CPU 10, the exponent/clock selecting circuit 32 generates an exponent select signal, and writes the exponent select signal in the exponent register 33 as the exponent setting value for selecting an exponent.

Alternatively, an exponent external input signal is supplied to the exponent/clock selecting circuit 32 from the outside. Based on the exponent external input signal, the exponent/clock selecting circuit 32 generates an exponent select signal, and writes the exponent select signal in the exponent register 33.

Based on the exponent setting value stored in the exponent register 33, the decoder circuit 34 generates an exponent/significand separating signal and a count value setting signal. The decoder circuit 34 then outputs the exponent/significand separating signal to the data register 3, and outputs the count value setting signal to the counter circuit 31.

The count enabling signal generating circuit 35 generates a count enabling signal ENABLE for specifying the start and the end of a counting operation of the counter circuit 31, based on the detection signal EG1 and the detection signal EG2 that are supplied from the edge detecting circuit 6. The count enabling signal generating circuit 35 then outputs the count enabling signal ENABLE to the counter circuit 31.

As described above, the counter circuit 31 counts the count clock signal CLK that is output from the selector circuit 15, starting from when the count enabling signal ENABLE that is output from the count enabling signal generating circuit 35 of the control circuit 30 switches to H level (the counting operation start) until when the count enabling signal ENABLE switches to L level (the counting operation end). The counter circuit 31 then outputs the count value to the data register 3. The data register 3 stores the count value supplied from the counter circuit 31.

FIG. 6 illustrates the operation of the counter circuit of a pulse width measuring device in accordance with the present invention. FIGS. 7A through 7G are waveform charts illustrating the operation of a pulse width measuring device in accordance with the present invention.

The example shown in FIG. 6 illustrates the operation of the counter circuit 31 when the counter value overflows, with the exponent of the counter circuit 31 having 4 bits, and the significand of the counter circuit 31 having 4 bits.

As shown in FIGS. 7A through 7G, immediately before the count value overflows, the exponent setting value of the exponent register 33 (shown in FIG. 7D) is 4, the count value of the significand of the counter circuit 31 (shown in FIG. 7E) is 15, and the value of the exponent of the counter circuit 31 (shown in FIG. 7F) is 15.

When the count value overflows, the exponent/clock selecting circuit 32 writes the exponent select signal in the exponent register 33, based on the exponent control signal that is transmitted from the CPU 10. Here, the exponent setting value of the exponent register 33 (shown in FIG. 7D) changes from 4 to 5. The decoder circuit 34 generates a count value setting signal, based on the exponent setting value of the exponent register 33. The decoder circuit 34 then outputs the count value setting signal to the counter circuit 31. Here, the exponent is increased by 1 bit, but the significand is decreased by 1 bit. Therefore, the count value of the significand (shown in FIG. 7E) changes to (15+1)/4=4, and the value of the exponent (shown in FIG. 7F) changes to (15+1+1)=17. The decoder circuit 34 generates an exponent/significand separating signal and a count value setting signal that are suitable for this case, and outputs these signals to the data register 3 and the counter circuit 31.

At the same time, the exponent/clock selecting circuit 32 generates a clock select signal, based on the control signal CO supplied from the counter circuit 31. The exponent/clock selecting circuit 32 then outputs the clock select signal to the selector circuit 15. In accordance with the clock select signal, the selector circuit 15 selects a clock signal (the $2^{17}$ clock in FIG. 7C) that is lower than the previous clock signal (the $2^{15}$ clock in FIG. 7A) by two frequency levels. The selector circuit 15 then outputs the selected clock signal as the count clock signal CLK to the counter circuit 31.

As described above, the exponent and the significand of the counter circuit 31 are separated from each other, and the counting operation continues. When the counter circuit 31 is set to have an exponent of 5 bits and a significand of 3 bits, the count value of the counter circuit 31 becomes $2^{17} \times 4 = 524288$.

This is because it is necessary to perform the operation of calculating the value of the significand by dividing the sum of 1 and the previous significand value of 15 by 4, and calculating the exponent by adding 2 to the previous exponent value of 15, since the number of bits of the significand decreases to 3 from 4 and the count value of the counter circuit 31 does not become ($2^{15} \times 15 = 491520 \rightarrow 2^{15} \times 16 = 524288$).

Next, the general operations of the control circuit 30 and the counter circuit 31 in a pulse width measuring device in accordance with the present invention are described in chronological order.

In the following, the counter circuit 31 counts up the counter at each rise of the count clock signal CLK. Instead, it is of course possible to employ a counter circuit that counts up the counter at each fall of the counter clock signal CLK, or a counter circuit that counts up the counter at each rise and each fall of the count clock signal CLK.

When the rise of the measured signal IN (the start edge) is detected, the counter circuit 31 resets the counter or sets a count value, thereby starting a counting operation. Here, the count value of the significand is 0h, the exponent setting value is 1, and the clock select signal is CLK0 (the clock signal with the shortest period).

The counter circuit 31 counts up the counter at the first rise of the clock signal CLK0. Here, the count value of the significand is 1h, the exponent setting value is 1, and the clock select signal is CLK0 (the clock signal with the shortest period).

The counter circuit 31 counts up the counter at the next rise of the clock signal CLK0. Here, the count value of the significand is 2h, the exponent setting value is 1, and the clock select signal is CLK0 (the clock signal with the shortest period).

When the fall (the ending edge) of the measured signal IN is detected, the pulse width measuring device calculates the product of the count value of the counter circuit 31 and the period of the clock signal CLK0, and takes in the product as the pulse width (the capture value) of the measured signal IN.

If the counting operation is continued, without the ending edge being detected, all the 7 bits of the significand of the counter circuit 31 become 1. Here, the count value of the significand is 7Fh, the exponent setting value is 1, and the clock select signal is CLK0 (the clock signal with the shortest period).

When the counter circuit 31 counts up the counter in the above situation, the significand overflows. Therefore, the counter circuit 31 counts up the exponent and halves the value of the significand. Here, the count value of the significand is C0h, the exponent setting value is 1, and the clock select signal is CLK0 (the clock signal with the shortest period).

The counting operation further advances, and all the 8 bits of the exponent and the significand of the count value become 1. Here, the count value of the significand is FFh, the exponent setting value is 1, and the clock select signal is CLK0 (the clock signal with the shortest period).

The counter circuit 31 then counts up the counter at the next rise of the clock signal CLK0. By doing so, the control signal CO is output, and the CPU 10 or the control circuit 30 again calculates the exponent setting value of the exponent register 33 and the count value.

The number of bits in the exponent is first increased to two. In doing so, the number of bits in the significand decreases by 1. Accordingly, the exponent changes from $2^1$ to $2^3$, and the value of the exponent becomes "11b". Being halved twice, the value of the significand changes to "20h", which is a fourth of "80h". Since the previous count value is $2^1 \times 7Fh = 2 \times 127 = 254$, the current count value becomes $2^3 \times 20h = 8 \times 32 = 256$. Here, the count value of the significand is E0h, the exponent setting value is 2, and the clock select signal is CLK1 (the clock signal with the second shortest period).

The counter circuit 31 counts up the counter at the next rise of the clock signal CLK1. Here, the count value of the significand is E1h, the exponent setting value is 2, and the clock select signal is CLK1 (the clock signal with the second shortest period).

The counter circuit 31 further counts up the counter at the next rise of the clock signal CLK1. Here, the count value of the significand is E2h, the exponent setting value is 2, and the clock select signal is CLK1 (the clock signal with the second shortest period).

The counting operation further advances, and all the 8 bits of the exponent and the significand of the count value become 1. Here, the count value of the significand is FFh, the exponent setting value is 2, and the clock select signal is CLK1 (the clock signal with the second shortest period).

The counter circuit 31 counts up the counter at the next rise of the clock signal CLK1. By doing so, the control signal CO is output, and the CPU 10 or the control circuit 30 again calculates the exponent setting value of the exponent register 33 and the count value.

The number of bits in the exponent is first increased to three. In doing so, the number of bits in the significand decreases by 1. Accordingly, the exponent changes from $2^3$ to $2^5$, and the value of the exponent becomes "101b". Being halved twice, the value of the significand changes to "10h", which is a fourth of "40h". Since the previous count value is $2^3 \times 3Fh = 8 \times 63 = 504$, the current count value becomes $2^5 \times 10h = 32 \times 16 = 512$. Here, the count value of the significand is B0h, the exponent setting value is 3, and the clock select signal is CLK2 (the clock signal with the third shortest period).

If the counting operation is continued, without the ending edge being detected, the control circuit 30 and the counter circuit 31 of the pulse width measuring device repeats the same counting operation as the above.

As described above, in the pulse width measuring device of the present invention, the exponent and the significand of the bit width of the counter circuit are separated from each other, so that the optimum clock frequency for the pulse width to be measured can be automatically selected from a wide clock range, using the counter circuit with the limited number of bits. Also, the counting operation can be continued, while preventing an increase in the circuit size and preventing the counter circuit from overflowing.

Although the present invention has been described by way of examples, it is not limited to those examples, and various changes modifications can be made without departing from the scope of the invention as claimed in claims.

The invention claim is:

1. A pulse width measuring device comprising:
   an edge detecting circuit that outputs a detection signal by detecting a rise or fall of a signal to be measured;
   a control unit that outputs a count start/end signal, based on the detection signal;
   a counter circuit that counts a count clock signal, based on the count start/end signal;

a count value storing unit that stores the count value of the counter circuit; and a selector circuit that selects a clock signal from a plurality of clock signals of different frequencies, based on a clock select signal, and outputs the selected clock signal as the count clock signal, the pulse width measuring device calculating the pulse width of the signal to be measured, based on the count value and the count clock signal, wherein:

the counter circuit has a plurality of bits that are divided into an exponent and a significand; and the control unit comprises:

an exponent storing unit that stores an exponent setting value that represents the number of bits of the exponent of the counter circuit; and a decoder unit that generates a count value setting signal for rewriting the count value of the counter circuit, based on the exponent setting value stored in the exponent storing unit, when the count value overflows in the counter circuit, the decoder unit then outputting the count value setting signal to the counter circuit.

2. The pulse width measuring device as claimed in claim 1, wherein the decoder unit generates an exponent/significand separating signal, based on the exponent setting value stored in the exponent storing unit, when the count value overflows in the counter circuit, the decoder unit then outputting the exponent/significand separating signal to the count value storing unit.

3. The pulse width measuring device as claimed in claim 1, wherein the control unit comprises an exponent/clock selecting unit that generates an exponent select signal, based on an exponent control signal that is output when the count value overflows in the counter circuit, the exponent/clock selecting unit writing the exponent setting value in the exponent storing unit.

4. The pulse width measuring device as claimed in claim 1, wherein the control unit comprises an exponent/clock selecting unit that generates an exponent select signal, based on an exponent control signal that is output in accordance with a control signal that is output from the counter circuit, the exponent/clock selecting unit then writing the exponent setting value in the exponent storing unit.

5. The pulse width measuring device as claimed in claim 1, wherein the control unit comprises an exponent/clock selecting unit that generates an exponent select signal based on an input signal that is input from the outside, the exponent/clock selecting unit then writing the exponent setting value in the exponent storing unit.

6. The pulse width measuring device as claimed in claim 1, wherein the control unit comprises a signal generating unit that outputs the count start/end signal, based on the detection signal that is output from the edge detecting circuit.

7. The pulse width measuring device as claimed in claim 1, wherein the control unit comprises an exponent/clock selecting unit that generates the clock select signal, based on a control signal that is output from the counter circuit, the exponent/clock selecting unit then outputting the clock select signal to the selector circuit.

8. The pulse width measuring device as claimed in claim 1, wherein the number of bits of the exponent storing unit is set in accordance with the number of bits of the counter circuit.

* * * * *